United States Patent
Dietz et al.

(10) Patent No.: US 6,396,272 B1
(45) Date of Patent: May 28, 2002

(54) METHOD OF CANCELLING LORENTZ FORCE-PRODUCED OSCILLATIONS IN A GRADIENT TUBE, AND MAGNETIC RESONANCE IMAGING APPARATUS OPERATING ACCORDING TO THE METHOD

(75) Inventors: Peter Dietz, Nuremberg; Winfried Arz; Rudolf Roeckelein, both of Erlangen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/488,719

(22) Filed: Jan. 20, 2000

(30) Foreign Application Priority Data

Jan. 21, 1999 (DE) ........................ 199 02 323

(51) Int. Cl.$^7$ ................................. G01V 3/00
(52) U.S. Cl. ................... 324/318; 324/322; 324/309
(58) Field of Search ................ 324/300–322, 324/225; 62/3.1

(56) References Cited

U.S. PATENT DOCUMENTS

| | | | |
|---|---|---|---|
| 4,535,595 A | * 8/1985 | Keller et al. | 62/3.1 |
| 5,617,026 A | 4/1997 | Yoshimo et al. | 324/318 |
| 6,208,135 B1 | * 3/2001 | Shattil | 324/225 |
| 6,211,671 B1 | * 4/2001 | Shattil | 324/225 |

OTHER PUBLICATIONS

"Vibration Control of a Cylindrical Shell Used in MRI Equipment," Qiu et al., Smart Mater. Struct., vol. 4 (1995) A75–A81.

* cited by examiner

*Primary Examiner*—Edward Lefkowitz
*Assistant Examiner*—Tiffany A. Fetzner
(74) *Attorney, Agent, or Firm*—Schiff Hardin & Waite

(57) ABSTRACT

In a method for the operation of a magnetic resonance apparatus having at least one gradient coil and elements for generating a force acting on the gradient tube, with which natural oscillation modes of the gradient tube are excited, so as to oppose oscillations of the gradient tube produced by Lorentz forces, drive signals are supplied for the excitation of the elements, and the amplitudes and/or the phases of the drive signals are varied for adjusting the force generated by the elements and acting on the gradient tube so as to compensate modifications of the oscillatory behavior of the gradient tube. The drive signals are varied dependent on at least one measured value representing a criterion for the change of the oscillatory behavior.

26 Claims, 2 Drawing Sheets

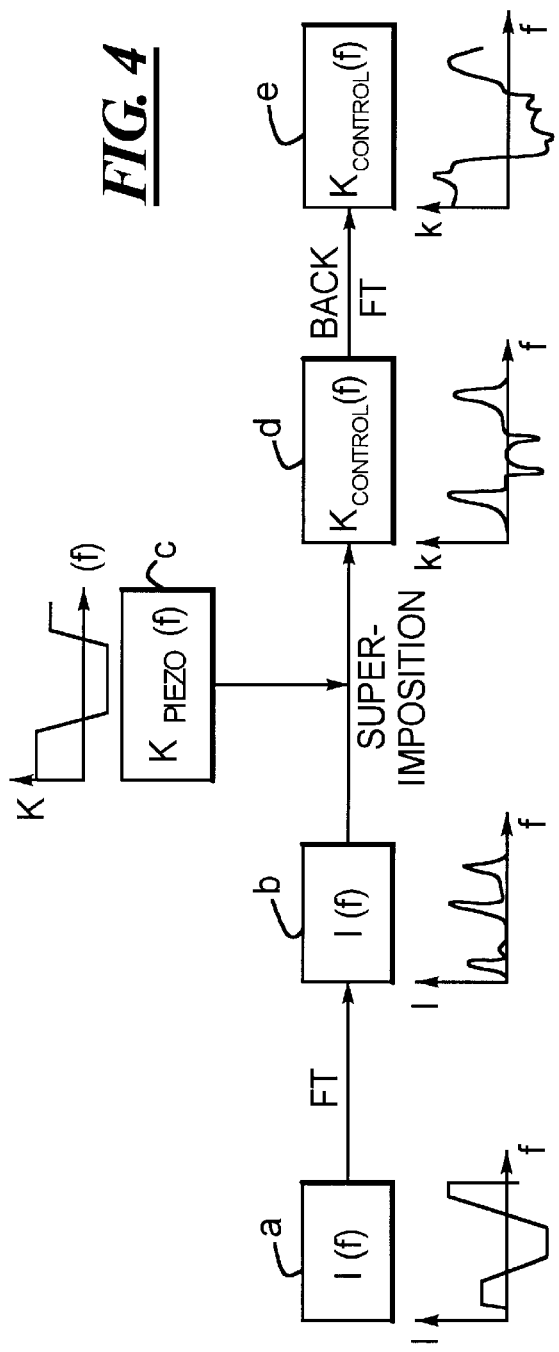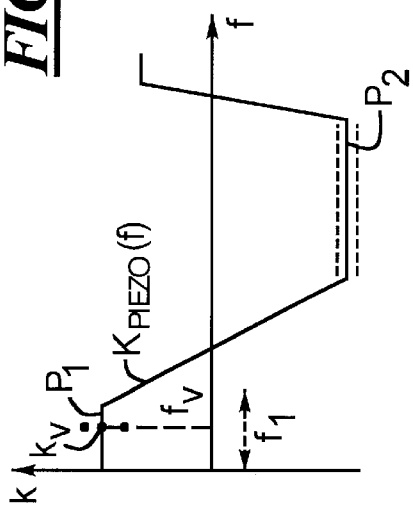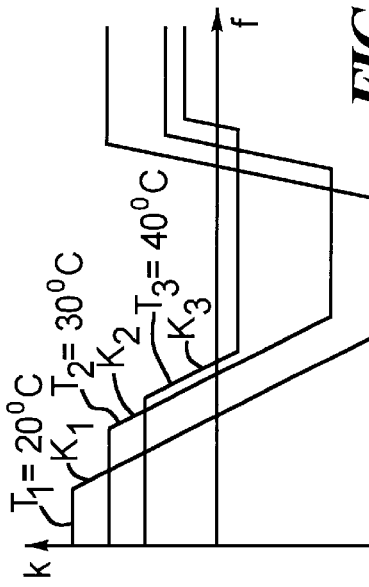

METHOD OF CANCELLING LORENTZ FORCE-PRODUCED OSCILLATIONS IN A GRADIENT TUBE, AND MAGNETIC RESONANCE IMAGING APPARATUS OPERATING ACCORDING TO THE METHOD

BACKGROUND OF THE INVENTION

1. Field of the Invention

The present invention is directed to a method for operating a magnetic resonance apparatus having a gradient tube at which at least one gradient coil, in which current flows during operation, is arranged, and at which a number of elements are arranged for generating a force as needed that acts on the gradient tube to counteract oscillations of the tube.

2. Description of the Prior Art and Related Application

With a magnetic resonance apparatus, tomograms of an examination subject, usually a patient, can be obtained through specific body planes. This occurs with the use of electromagnetic fields. In order to enable spatial resolution of the signal obtained in the presence of an applied magnetostatic basic field and an exciting radio frequency field, a gradient field is produced with a number of gradient coils. Gradually, three different gradient coils are utilized that produce fields in the x, y, z directions with respect to the gradient tube. Due to the flow of current in these coils, Lorentz forces occur that act on the gradient tube and cause it to oscillate due to their time curve. These mechanical oscillations in turn cause the air around the gradient tube to exhibit fluctuations in air pressure. These oscillations are the cause for a considerable development of noise during the operation of the magnetic resonance apparatus. Noise peaks far above 100 dB occur. In order to oppose these oscillations and, consequently, to dampen the noise, it is known, for example from German OS 44 32 747, to generate opposing forces with piezoelectric elements that are arranged at the gradient tube and to thus cancel the oscillations excited by Lorentz forces. The arrangement of the piezoelectric elements disclosed therein, however, ensues essentially in the region of the coil conductors. The described arrangement is non-selective in view of the actually generated oscillations; a targeted noise damping is consequently not possible.

In order to achieve noticeably improved noise damping, German Patent Application 198 29 296 corresponding to pending U.S. application Ser. No. 09/343,848, filed Jun. 30, 1999 ("Magnetic Resonance Apparatus," Dietz et al.), discloses exciting one or more natural oscillation modes of the gradient tube with the elements arranged at the gradient tube, while opposing the oscillations of the gradient tube produced by the Lorentz forces. It has been shown that each oscillation of the gradient tube is a superimposition of a number of natural oscillation modes, i.e. each oscillation can be reduced to specific natural oscillation modes. The natural oscillation modes can supply different contributions to the actual tube oscillation; the elements, however, allow specific natural oscillation modes to be intentionally and specifically excited, so as to oppose the respective natural oscillation mode components of the tube oscillations, and thereby eliminating them. A considerable reduction of the noise can be achieved as a result. Change in the oscillatory behavior of the gradient tube can occur, however, during the operation of the magnetic resonance apparatus or during a longer operating time thereof. These can be reversible or irreversible modifications of the initial conditions. A rigid drive spectrum of the elements, i.e. a force on the gradient tube generated by the elements that is always constant, is non-specific in view of the changes which may occur, and can no longer adequately compensate these.

SUMMARY OF THE INVENTION

It is an object of the present invention to provide a method of the type initially described that enables compensation of vibratory changes as may occur during the operation of a magnetic resonance apparatus.

This object is inventively achieved in a method for operating a magnetic resonance apparatus having a gradient tube at which at least one gradient coil is mounted that has current-flowing therein during operation, and at which a number of elements are attached for generating a force as needed that acts on the gradient tube to counteract oscillations (vibrations), wherein one or more natural oscillation modes of the gradient tube are excited with the elements, to oppose the oscillations of the gradient tube produced by Lorentz forces that are generated as a consequence of the flow of current through the gradient coils, and wherein frequency-dependent drive signals are used for the excitation of the elements, the amplitudes and/or the phases of the drive signals for modifying the force generated by the elements and acting on the gradient tube having varied for compensation of a change of the oscillatory behavior of the gradient tube, dependent on at least one measured value representing a criterion for the change of the oscillatory behavior.

In the inventive method, at least one measured value is identified, which serves as a criterion for the change of the oscillatory behavior, i.e. the modified oscillatory behavior is directly or indirectly acquired with the measured value. Dependent on this measured value, a modification of the drive signals of the force-generating elements subsequently ensues, i.e. the generated force is varied and set dependent on the oscillatory change, so that this oscillatory change can be largely compensated. The variation ensues by modifying the amplitude and/or the phase of the force, these being available as variable quantities, but it is primarily variation of the amplitude that is suitable for compensation. The phase of the drive is usually very stable, since the force of the force-generating elements must always oppose the Lorentz forces and this is only possible in a well-defined phase relationship; due to a time-delayed response behavior of the force-generating elements relative to the control signal, nevertheless some potential oscillatory changes resulting therefrom can be compensated by phase variation. Changes in the oscillatory behavior of the tube can be determined directly from the gradient tube. For example, as a result of the flow of current through the gradient coils, the tube may be heated. This change is reversible, i.e. the oscillatory behavior also changes correspondingly when the tube cools. In addition, changes can be produced, for example, by aging of the tube, for example, resulting in a change of the modulus of elasticity, caused, for example, by the cyclical heating and cooling that repeatedly occur during prolonged use. The attenuation of the gradient tube also may change. Further, the influence of the force of the force-generating elements on the tube can change, for example due to fatigue of the material with local modification of the material properties; the force-generating elements themselves also can age, so that the force that is generated decreases despite the same drive. The modifications of the oscillatory behavior resulting in one or more of these sources can be advantageously compensated with the inventive method.

When the modification can be attributed exclusively to a change in a force-generating element (for example, partial or complete failure), then this change should likewise be compensated at only this element. (Replacement or adaptation of the drive of this one element to the required force) Respective sensors can be disposed at each force-generating element which, when the force-generating element is being driven, serve as a force-measuring sensor whose signal is used only for the controlling drive of the one element at which it is desired. When the force-generating element is not being driven, the sensor measures excursions generated by the other force-generating elements relative to a previously identified reference value. An arbitrary sensor (excursion, acceleration, expansion) can be used for this purpose.

Further features relate to all force-generating elements of a group in common:

It has proven expedient when the change of the drive signals ensues on the basis of a change of at least one drive curve stored in a control unit, the drive curve representing frequency dependent values for the force to be exerted by the elements on the gradient tube so as to generate the natural oscillations. Such drive curves exist for each group of elements that are provided for exciting a specific natural oscillation mode and represent a frequency characteristic that indicates the amplitude and phase for the signal to be provided to the force-generating elements of an element group in order to compensate the effect of the Lorentz force of a sinusoidal excitation having a normalized strength of one at the respective frequency. The effect must be set by means of the phase so that the influence of the force of the force-generating elements opposes that of the Lorentz force. A different, higher or lower force is to be exerted due to the change in oscillation, this being able to be easily taken into consideration by variation of the "force drive curve", based on which the actual drive signals are calculated in the control unit. The determination of the drive signals can inventively ensue by separating the individual, direction-dependent signal curves for the respective gradient axes from a time-dependent drive signal curve for the gradient coils located at the gradient tube, and frequency-dependent drive signal curves are generated by Fourier transformation. These curves as subsequently superimposed with the drive curve or curves that are respectively allocated to a specific group of elements of the respective gradient axis, after which the superimposition curves that are obtained are converted by Fourier back-transformation into specific time-dependent drive signal curves for the respective element groups. This manner of determining the drive signals is advantageous from two points of view. First, it makes it possible to react to the time signal of the gradient current, which is extremely important insofar as the gradient current is the cause generating the Lorentz forces. By computational operation or by taking the gradient current signal into consideration in the framework of the determination of the drive signals for the elements, the time component of the gradient current can be taken into consideration within the time-dependent drive signals for the force-generating elements. The second advantage of this embodiment of the method is that since the drive signal curve always remains the same for the gradient coils, only the force drive curves need to be varied in the framework of the determination, i.e. only one processing parameter, namely the force drive curve to be superimposed, is modified within the computational procedure in order to obtain the required, new drive characteristics serving the purpose of compensation.

A measured value for a reversible oscillation change can be inventively identified, for example the temperature of the gradient tube. Even though compensation can be achieved by a suitable variation of the element group-specific drive curves originally stored, it has proven expedient to store a family of drive curves in the control unit. Each family can be allocated to a specific measured value or to a measured value interval, and a drive curve on which the drive signal is to be based can be selected therefrom dependent on the measured value.

Alternatively or additionally, the oscillations of the gradient tube can be registered as further measured values related to natural oscillation. This applies both for compensation of oscillatory changes caused by temperature fluctuation as well as for determining system changes that are quasi non-reversible and, for example, are attributable to fatigue phenomena, material changes or power losses in the force-generating elements. The amplitudes of the intrinsic oscillations can be measured as the measured values. It has proven especially expedient when the drive signals are inventively varied for compensation with substantially simultaneous identification of the measured values related to natural oscillation and the effect of the variation is checked on the basis of the measured values. In this case, a control circuit is employed wherein the compensation effect is checked during or after a modification of the drive signals. When, for example, the force exerted by an element group for generating a specific natural oscillation mode is increased for compensation, it can thus be recognized after the first or after a few incremental steps whether an incrementation in fact leads to a compensation. If not, variation by means of the control unit can ensue such that the generated force is reduced, the effect likewise always being checked in this case as well. The modification of, for example, the amplitude of the drive signals or of the drive curve as the cause thereof, thereby occurs until a compensation optimum has been achieved. It has proven adequate when only one frequency-related signal of the drive curve of the elements is inventively varied with respect to each intrinsic oscillation to be compensated. Alternatively, it is also possible to vary a signal group of a specific frequency range.

A number of sensor elements arranged at the gradient tube can be inventively employed for determining the measured values. The sensor elements for determining the temperature should be arranged close to the elements themselves since the temperature of the force-generating elements, which can be responsible for a change in the function thereof, can thereby also be simultaneously acquired. For determining the oscillations of the gradient tube, further, at least as many sensor elements as there are natural oscillation modes to be suppressed should be employed. The different oscillation modes are known; the number of important modes is surveyable. In the ideal case, just as many sensor elements thus exist as there are oscillatory modes per spatial direction to be taken into consideration. Mathematically considered, the natural oscillation modes form a vector space and the sensor elements represent the supporting points at which the function is known. The placement of the sensor elements must be such that an adequate input signal that is forwarded to the drive unit is made available. The sensor elements thus should not lie on a common node line of a number of modes or assume symmetrical positions that do not deliver any relevant information. The placement of the sensors within a small segment region of the tube is sufficient i.e. they need not be distributed over the entire tube.

In addition to being directed to the method, the invention is also directed to a magnetic resonance apparatus having a gradient tube at which at least one gradient coil is mounted that has current-flowing thereon during operation and at which a number of elements are arranged for generating a force as needed that acts on the gradient tube, with the position of the elements being selected dependent on at least one natural oscillation mode of the gradient tube, so that the respective natural oscillation mode can be excited during operation of the elements, and wherein at least one sensor element is provided for determining at least one measured value that represents a criterion for a change of the oscillatory behavior of the gradient pipe, and wherein a control unit varies the amplitude and/or of the phase of frequency-related drive signals, with which the elements are driven, dependent on the measured value, so that the change of the oscillatory behavior can be at least partially compensated.

Force sensors as well as temperature sensors can be employed as the sensor elements, as can sensor elements that supply natural oscillation-related measured values for the tube oscillation itself. At least as many oscillation sensors as there are natural oscillation modes to be suppressed can be inventively provided. The sensor elements should be arranged in the longitudinal tube direction and in the circumferential tube direction and should be spaced substantially equidistantly from one another. It is sufficient for the sensor elements to be arranged only over a partial length and a partial circumference of the gradient tube, for example, a ⅛ segment. For example, acceleration sensors, expansion sensors or force sensors can be employed as the sensor elements.

DESCRIPTION OF THE DRAWINGS

FIG. 4 is a flow chart illustrating the determination of the drive signals serving for compensation in the inventive method and apparatus.

FIG. 5 shows an example of a family of temperature-related drive curves for use in the inventive method and apparatus.

FIG. 6 shows an example of the variation of a drive curve for use in the inventive method and apparatus.

DESCRIPTION OF THE PREFERRED EMBODIMENTS

Figure 1:
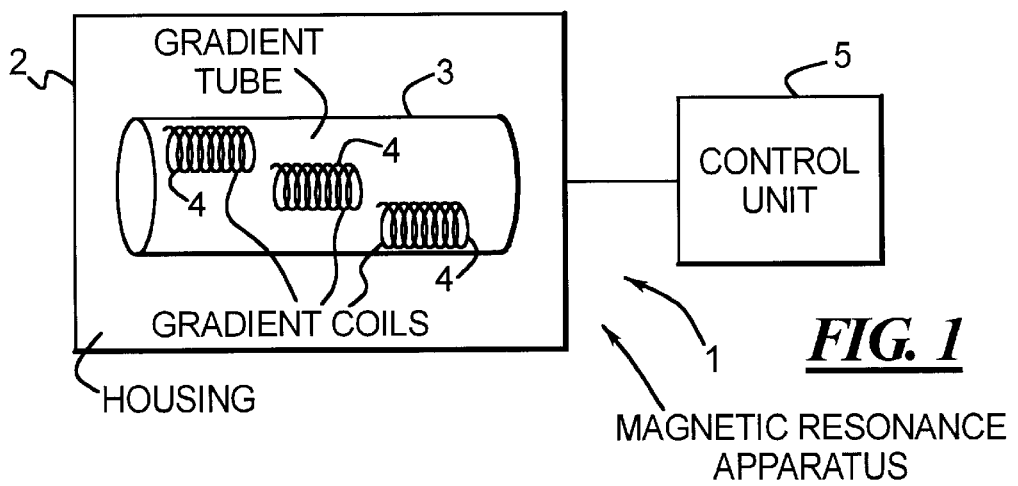
FIG. 1 is a schematic illustration of an inventive magnetic resonance apparatus.
Figure 2:
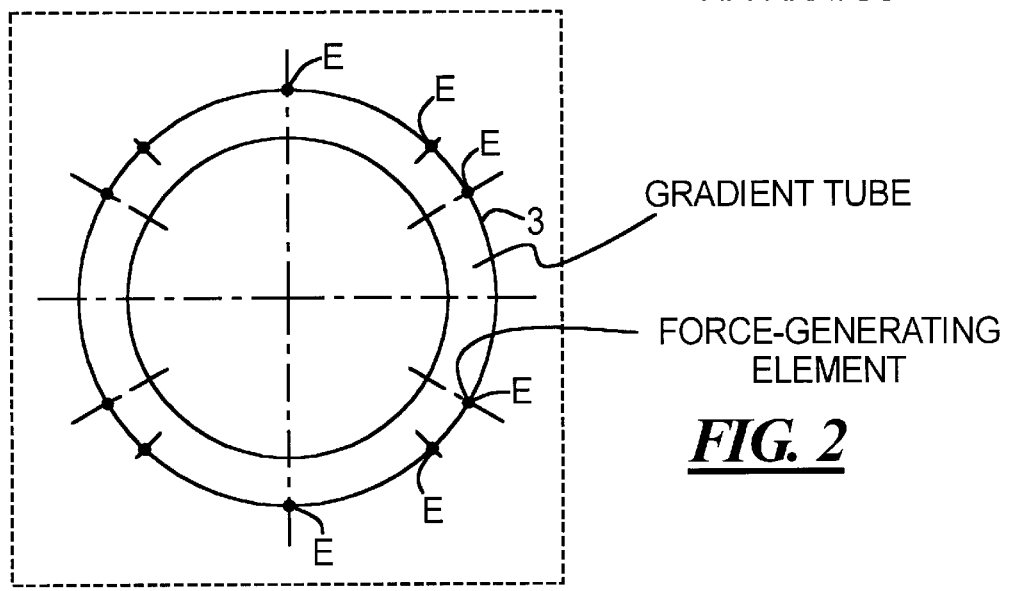
FIG. 2 is a schematic illustration of the arrangement of a number of elements for generating specific natural oscillation modes at a gradient tube in the apparatus of FIG. 1.
Figure 3:
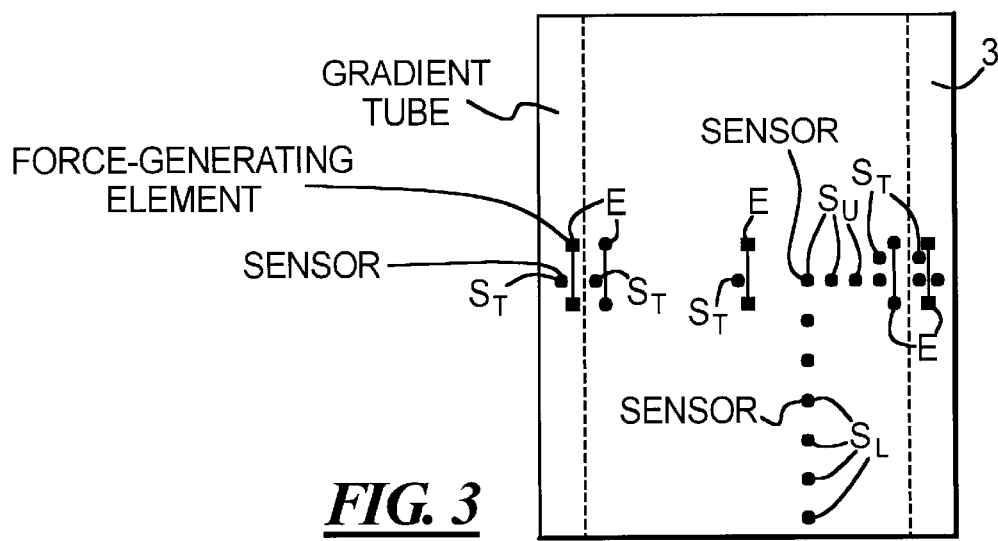
FIG. 3 is a plan view of the gradient tube of FIG. 2.

FIG. 1 shows an inventive magnetic resonance apparatus 1 composed of an apparatus housing 2 having a gradient pipe 3 arranged therein with gradient coils 4 arranged at or on the tube 3, these coils 4 being only schematically shown here and being actually arranged according to the direction-dependent field to be respectively generated by each of the coils 4. Further, a control unit 5 that controls the operation of the magnetic resonance apparatus 1 is provided. A number of force generating elements E are provided at the gradient tube 3 (FIGS. 2, 3). These elements E may be piezoelements. Controlled via the control unit 5, these elements E are charged with voltage and generate a force acting on the gradient tube 3 due to the voltage-caused change in shape of each element E. All elements E are placed at the gradient tube 3 such that specific natural oscillation modes of the gradient tube 3 can be excited in defined fashion as a result of their operation. The respective forces generated by elements E are selected exactly such that oscillations of the tube 3 produced during operation of the magnetic resonance apparatus due to Lorentz forces occurring due to a flow of current through the gradient coils 4 are substantially compensated, i.e. the natural oscillation made that can be excited with the elements E has substantially the same amplitude and phase as the Lorentz force-produced oscillation, so that the oscillation modes mutually cancel.

The arrangement of the elements E shown in FIGS. 2 and 3 is only an example; which intrinsic oscillation modes are specifically excited here is not of importance to the control technique described herein. Co-pending U.S. application Ser. No. 09/343,848 ("Magnetic Resonance Apparatus," Dietz et al.) assigned to the same assignee as the present application, discloses further details of the placement and operation of the elements E, and the contents thereof are incorporated herein by reference.

As FIG. 3 also shows, further sensor elements are provided at the outside cladding of the gradient tube 3. A distinction is made here between sensor elements $S_L$ arranged in the longitudinal direction and sensor elements $S_U$ arranged in the circumferential direction. The sensor elements $S_L$ and $S_U$ serve the purpose of identifying (sensing) oscillations of the gradient tube 3. They supply natural oscillation-related measured values that make it possible to separate the intrinsic oscillation components within the overall oscillation of the gradient tube 3. At least as many sensor elements should be provided as there are relevant oscillation modes per spatial direction. The sensor elements $S_L$ can, for example, be arranged at an angular positions of 20° in the longitudinal direction and can be equidistantly spaced from one another.

The sensor element closes to the end of the tube 3 should be at some distance from the end. In the illustrated example, a position in the middle of the length of the tube 3 is selected for the placement in the circumferential direction (sensor elements $S_U$). The sensor elements $S_U$ are likewise placed equidistantly in the circumferential direction, but the first and the last sensor elements should not be arranged at 0° and 90°. It is adequate when the sensor elements $S_L$, $S_U$ are arranged so as to be distributed over, for example, only a ⅛ segment of the gradient tube 3. The control unit 5 can determine the amplitude of each natural oscillation form from the measured value determined by the sensor elements $S_L$, $S_U$. As needed, it is also possible to use the elements E themselves as sensor elements, these then being switched in operation between force generation and acquisition of measured values, in alternation.

Further, a number of sensor elements $S_T$ are provided that serve the purpose of acquiring the temperature of the gradient tube 3. Each sensor element $S_T$ shown in FIG. 3 is arranged directly at a sensor element E, so that it is also simultaneously possible to determine the temperature of the element E. The temperature of the tube 3 as well as of the adjacent element E can influence the oscillatory behavior and thus the force generation behavior of the element E. The sensor elements $S_T$ make it possible to identify reversible oscillatory changes; the sensor elements $S_L$, $S_U$ basically serve for determining non-reversible oscillatory changes that are caused by irreversible system changes such as, for example, material fatigue of the tube 3, fatigue of the force-generating elements, and the like.

In the form of a flow chart, FIG. 4 shows the determination of the drive signals for a group of elements E for generating a specific natural oscillation mode. As described, the Lorentz forces produced by the flow of current through the gradient coils 4 are the cause of the oscillatory behavior of the gradient tube 3. Since the counter-oscillations generated by the force-generating elements E oppose the natural oscillations caused by the Lorentz forces and are intended to cancel them, these counter-oscillations consequently must be generated synchronously with those natural oscillations. In order to allow for an arbitrary curve shape with respect time of the gradient current signal, the determination of the drive signals for the force-generating elements E is made on the basis of the time-related current signal I(t)(=time-dependent drive signal curve) of the gradient current signal. FIG. 4 shows an exemplary curve of such a signal. In the illustrated example, only the general signal I(t) is shown in a first step a (i.e., driving a gradient coil with the signal I(t)). The gradient signal employed during operation of the magnetic resonance apparatus is composed of three superimposed, individual signals for the respective gradient axes x, y, z. The common gradient signal is first divided into the respective gradient axis-specific signals. The signal I(t) shown in FIG. 4 represents an example of one of these split, axis-specific signals. The procedure is the same for each axis-specific signal, for which reason no differentiation has been made here.

Subsequently, the signals I(t) are subjected to a Fourier transformation (FT) in step b in order to generate a frequency-dependent, complex current signal I(f) (drive signal curve that is frequency-dependent in amplitude and phase). FIG. 4 also shows an example of such a frequency-related signal curve. The respective exemplary curves are not precisely mathematically related to one another, but merely represent examples of the inventive principle.

In the next step c, the signal spectrum I(f) is superimposed with the frequency-related force curve $K_{Piezo}(f)$. This force curve contains frequency-related force values which should be produced by the respective elements E in order to generate a specific natural oscillation mode. This element group is allocated to the respective gradient axis whose gradient current signal is processed. The superimposition corresponds to a re-weighting of the frequency components. The force curve $K_{Piezo}(f)$ is the drive curve that is varied for compensation of an oscillatory change, as discussed below. The superimposition supplies a frequency-related force control signal curve $K_{Control}(f)$ (superimposition curve) in step d. By Fourier back-transformation (back-FT) a time-related force control signal curve ($K_{Control}(t)$)(time-dependent drive signal curve) is generated in step e. This drive signal curve is subsequently also weighted in view of the respective group to which individual elements E belong, since each element E need not be driven in the same mode; rather, the elements E of a function group must generate difference forces dependent on the mode-specific force, or the arrangement at the gradient tube 3. This, however, is of no concern in view of the general compensation method, for which reason this is not shown in greater detail. The curve $K_{Control}(t)$ thus represents the desired curve of the force of the force-generating elements E over time. For a specific drive of individual elements E, the force spectrum $K_{Control}(t)$ is converted into corresponding, time-related voltage values, after corresponding, element-specific weighting, which are applied to the respective force-generating elements E.

As described, the force exerted by the elements E for compensation of a change of the oscillation of the tube 3 is to be modified for generating the counter-oscillation. The corresponding adaptation or change of the drive signals ensues by variation of the frequency-related piezoelement force curve $K_{Piezo}(f)$. For addressing a reversible oscillatory change produced by a temperature elevation, for example due to the gradient coils 4 heating during operation, a family of drive curves is stored in the control unit 5, each curve in the family being allocated to a different temperature. FIG. 5 shows a basic example. The curve $K_1$ represents the frequency-related force curve for a temperature $T_1=20°$ C.; the curve $K_2$ applies to $T_2=30°$ C.; and the curve $K_3$ applies to $T_3=40°$ C. When, for example, a temperature of the tube 3 of T=30° C. is identified with one of the sensor elements $S_T$, then the control unit 5 automatically selects the curve $K_2$ and superimposes this as force curve $K_{Piezo, T=30° C.}(f)$ with the frequency-related current curve I(f). Since, as shown in FIG. 5, the curve $K_2$ exhibits a different frequency-related curve of the force than the curve $K_1$ previously used, a modification of the drive signal resulting from the processing according to FIG. 4 ultimately occurs, so that the temperature-caused change in oscillation can be reacted to. As an example, FIG. 5 shows only three curves; of course, even more curves can be stored within the curve family. Further, it is possible for curves to be allocated respectively to specific temperature intervals.

FIG. 6 shows how a force curve $K_{Piezo}(f)$ is varied when a non-reversible, system-caused oscillatory change occurs, as may be produced, for example, due to fatigue phenomena or the like. According to a first possibility, shown at the left in FIG. 6 with respect to the level $P_1$, a specific frequency $f_v$ (varying frequency) whose force value $k_v$ (varying force value) is varied is selected within the frequency range $f_1$ corresponding to the level $P_1$. For example, this force value $k_v$ can be initially automatically incremented by the control units, and the respective effect of this increment, which is expressed in a corresponding change of the specific drive signals, and thus in a change of the force actually generated, is identified via the sensor elements $S_L$, $S_U$. In the fashion of a feedback circuit, it is thus immediately registered whether the change in the respective direction (a boost in this example) leads to an improvement of the oscillation damping or not. In case of an improvement, the incremental increases are continued until a compensation optimum has been achieved. In the case of a degradation, the control unit 5 correspondingly reduces the force value $k_v$. Since the generated force within the frequency range $f_1$ at each frequency leads to a corresponding generation of the natural oscillation, it is adequate for a modification of the force value to be undertaken only at one frequency, since this increased or reduced force then leads to the generation of the modified natural oscillation regardless of which frequency $f_v$ is selected, as long as it lies within the frequency range $f_1$. When an optimum compensation has been achieved, the curve according to FIG. 6 can be correspondingly corrected overall in view of the position of the level $P_1$.

FIG. 6 also shows a further possibility of variation in the right half of FIG. 6. The entire level $P_2$ is lifted or lowered, as indicated by dashed lines. The effect of this variation is the same as that described above.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance apparatus having a gradient tube at which at least one gradient coil is mounted, said gradient coil having current flowing therein during operation of the magnetic resonance apparatus and thereby producing Lorentz forces which cause said gradient tube to exhibit oscillatory behavior in a natural oscillation mode, and having a plurality of force-generating elements which respectively generate forces which collectively act on said gradient tube to oppose said oscillatory behavior of said gradient tube caused by said Lorentz forces, said method comprising the steps of:

acquiring at least one measured value representing a criterion for a change in said oscillatory behavior of said gradient tube;

storing at least one drive curve in a control unit;

generating drive signals in said control unit from said at least one drive curve and driving said force-generating elements with said respective drive signals, each of said drive signals having an amplitude and a phase; and modifying said at least one drive curve dependent on said measured value to vary at least one of the amplitude and the phase of the respective drive signals to modify the respective forces generated by the force-generating elements to account for said change of said oscillatory behavior.

2. A method as claimed in claim 1 wherein the step of acquiring at least one measured value comprises acquiring a plurality of measured values by disposing sensor elements respectively at said force-generating elements and obtaining said plurality of measured values respectively from said sensor elements, and modifying respective drive signals only for force-generating elements at which a respective sensor element emits a measured value indicating a change of said oscillatory behavior.

3. A method as claimed in claim 1 wherein said magnetic resonance apparatus comprises three gradient coils mounted at said gradient tube, and respectively associated with three gradient axes of a Cartesian coordinate system, and wherein said method comprises the additional steps of:

grouping said force-generating elements into three groups respectively associated with said three gradient axes;

driving said gradient coils collectively with a time-dependent drive signal;

separating respective direction-dependent signal curves, for said three gradient axes, from said time-dependent drive signal;

Fourier transforming said direction-dependent signal curves to obtain respective frequency-dependent drive signal curves for the three gradient axes;

generating respective drive signals for said three groups of force-generating elements;

superimposing the respective drive signals for the three groups of force-generating elements with the respective frequency-dependent drive signal curves for said three gradient axes to obtain three superimposed curves;

Fourier back-transforming the respective superimposition curves to obtain three group-specific, time-dependent drive signal curves; and respectively driving said three groups of force-generating element with said three group-specific, time-dependent drive signal curves.

4. A method as claimed in claim 1 wherein the step of acquiring at least one measured value comprises measuring temperature of said gradient tube as said at least one measured value.

5. A method as claimed in claim 1 wherein said gradient tube exhibits a plurality of natural oscillation modes which can be respectively opposed by the respective forces generated by said force-generating elements, and wherein said method comprises the further steps of:

measuring oscillations of said gradient tube, as said measured value, with a plurality of sensors mounted at said gradient tube;

identifying one of said natural oscillation modes represented by said oscillatory behavior of said gradient tube; and employing a plurality of said sensors equal in number to said plurality of natural oscillation modes.

6. A method as claimed in claim 1 comprising:

wherein the step of storing at least one drive curve comprises storing a family of drive curves in said control unit respectively allocated to different values of said measured value;

wherein the step of modifying said at least one drive curve comprises selecting one of said drive curves, as a selected drive curve, dependent on said measured value; and generating said drive signals in said control unit dependent on said selected drive curve.

7. A method as claimed in claim 1 comprising:

wherein the step of storing at least one drive curve comprises storing a family of drive curves in said control unit respectively allocated to different ranges of said measured value;

wherein the step of modifying said at least one drive curve comprises selecting one of said drive curves, as a selected drive curve, dependent on said measured value; and generating said drive signals in said control unit dependent on said selected drive curve.

8. A method as claimed in claim 1 comprising measuring oscillations of said gradient tube at said at least one measured value.

9. A method as claimed in claim 8 comprising measuring an amplitude of said oscillations as said at least one measured value.

10. A method as claimed in claim 8 wherein the step of varying at least one of the amplitude and the phase of the drive signals comprises:

varying at least one of the amplitude and the phase of the drive signals substantially simultaneously with measuring said oscillations of said gradient tube; and determining an effect on said gradient tube of varying at least one of the amplitude and the phase of the drive signals by obtaining a further measurement of the oscillations of the gradient tube and, if necessary, again varying at least one of the amplitude and the phase of said drive signals.

11. A method as claimed in claim 10 wherein said drive signals have a frequency spectrum and comprising the additional steps of:

identifying one of a plurality of natural oscillation modes of said gradient tube from said measured oscillations; and varying at least one of the amplitude and the phase of said drive signals only at a single frequency within said frequency spectrum dependent on said one of said natural oscillation modes.

12. A method as claimed in claim 10 wherein said drive signals have a frequency spectrum and comprising the additional steps of:

identifying one of a plurality of natural oscillation modes of said gradient tube from said measured oscillations; and varying at least one of the amplitude and the phase of said drive signals only within a frequency range within said frequency spectrum dependent on said one of said natural oscillation modes.

13. A magnetic resonance apparatus comprising:

a gradient tube at which at least one gradient coil is mounted, said gradient coil having current flowing therein during operation of the magnetic resonance apparatus and thereby producing Lorentz forces which cause said gradient tube to exhibit oscillatory behavior in a natural oscillation mode;

a plurality of force-generating elements which respectively generate forces which collectively act on said gradient tube to oppose said oscillatory behavior of said gradient tube caused by said Lorentz forces;

a sensor for acquiring a measured value representing a criterion for a change in said oscillatory behavior of said gradient tube;

a control unit for driving said force-generating elements with respective drive signals, each of said drive signals having an amplitude and a phase; and a memory in which at least one drive curve is stored which contains frequency-dependent values, modified by said measured value, for the respective forces produced by said force-generating elements to collectively cause said gradient tube to oscillate in a natural oscillation mode, said control unit generating said drive signals from said at least one drive curve for varying at least one of the amplitude and the phase of the respective drive signals dependent on said criterion to modify the respective forces generated by the force-generating elements to account for said change of said oscillatory behavior.

14. A magnetic resonance apparatus as claimed in claim 13 comprising a plurality of sensor elements respectively disposed at said force-generating elements for acquiring a plurality of measured values respectively from said sensor elements, and wherein said control unit modifies respective drive signals only for force-generating elements at which a respective sensor element emits a measured value indicating a change of said oscillatory behavior.

15. A magnetic resonance apparatus as claimed in claim 13 comprising:

three gradient coils mounted at said gradient tube, and respectively associated with three gradient axes of a Cartesian coordinate system, and driven collectively with a time-dependent drive signal;

wherein said force-generating elements are generated into three groups respectively associated with said three gradient axes; and wherein said control unit separates respective direction-dependent signal curves, for said three gradient axes, from said time-dependent drive signal, Fourier transforms said direction-dependent signal curves to obtain respective frequency-dependent drive signal curves for the three gradient axes, generates respective drive signals for said three groups of force-generating elements, superimposes the respective drive signals for the three groups of force-generating elements with the respective frequency-dependent drive signal curves for said three gradient axes to obtain three superimposed curves, Fourier back-transforms the respective superimposition curves to obtain three group-specific, time-dependent drive signal curves, and respectively drives said three groups of force-generating element with said three group-specific, time-dependent drive signal curves.

16. A magnetic resonance apparatus as claimed in claim 13 wherein said sensor comprises a temperature sensor for measuring temperature of said gradient tube.

17. A magnetic resonance apparatus as claimed in claim 16 wherein said temperature sensor is disposed at one of said force-generating elements.

18. A magnetic resonance apparatus as claimed in claim 16 comprising a plurality of temperature sensors respectively disposed at said force-generating elements.

19. A magnetic resonance apparatus as claimed in claim 13 wherein:

said memory in said control unit stores a family of drive curves, said drive curves respectively being allocated to different values of said measured value; and said control unit selects one of said drive curves, as a selected drive curve, dependent on said measured value and generates said drive signals dependent on said selected drive curve.

20. A magnetic resonance apparatus as claimed in claim 13 wherein:

said memory in said control unit stores a family of drive curves, said drive curves respectively being allocated to different ranges of said measured value; and said control unit selects one of said drive curves, as a selected drive curve, dependent on said measured value and generates said drive signals dependent on said selected drive curve.

21. A magnetic resonance apparatus as claimed in claim 13 wherein said sensor measures oscillations of said gradient tube as said measured value.

22. A magnetic resonance apparatus as claimed in claim 21 wherein said sensor measures an amplitude of said oscillations as said at least one measured value.

23. A magnetic resonance apparatus as claimed in claim 21 wherein said control unit varies at least one of the amplitude and the phase of the drive signals substantially simultaneously with measuring said oscillations of said gradient tube, and determines an effect on said gradient tube of varying at least one of the amplitude and the phase of the drive signals by obtaining a further measurement of the oscillations of the gradient tube and, if necessary, again varies at least one of the amplitude and the phase of said drive signals.

24. A magnetic resonance apparatus as claimed in claim 23 wherein said drive signals have a frequency spectrum and wherein said control unit identifies one of a plurality of natural oscillation modes of said gradient tube from said measured oscillations, and varies at least one of the amplitude and the phase of said drive signals only at a single frequency within said frequency spectrum dependent on said one of said natural oscillation modes.

25. A magnetic resonance apparatus as claimed in claim 23 wherein said drive signals have a frequency spectrum and wherein said control unit identifies one of a plurality of natural oscillation modes of said gradient tube from said measured oscillations, and varies at least one of the amplitude and the phase of said drive signals only within a frequency range within said frequency spectrum dependent on said one of said natural oscillation modes.

26. A magnetic resonance apparatus as claimed in claim 13 wherein said gradient tube exhibits a plurality of natural oscillation modes which can be respectively opposed by the respective forces generated by said force-generating elements, and wherein said magnetic resonance apparatus comprises:

a plurality of sensors mounted at said gradient tube for measuring oscillations of said gradient tube, said plurality of said sensors being equal in number to said plurality of natural oscillation modes; and wherein said control unit identifies one of said natural oscillation modes represented by said oscillatory behavior of said gradient tube.

* * * * *